United States Patent
Eggers et al.

(10) Patent No.: US 6,705,228 B1
(45) Date of Patent: Mar. 16, 2004

(54) METHOD FOR SYNCHRONIZING POSITIONING AND EXPOSURE PROCESSES

(75) Inventors: Stefan Eggers, Wentorf (DE); Claas Andreae, Brietlingen (DE)

(73) Assignees: Basys Print GmbH Systeme fuer Druckindustrie, Boizenburg (DE); Toyo Ink. Mfg. Co., Ltd., Tokyo (JP)

(*) Notice: Subject to any disclaimer, the term of this patent is extended or adjusted under 35 U.S.C. 154(b) by 0 days.

(21) Appl. No.: 10/070,962
(22) PCT Filed: Aug. 11, 2000
(86) PCT No.: PCT/EP00/07840
§ 371 (c)(1), (2), (4) Date: Mar. 13, 2002
(87) PCT Pub. No.: WO01/22167
PCT Pub. Date: Mar. 29, 2001

(30) Foreign Application Priority Data

Sep. 17, 1999 (DE) .......................................... 199 44 759

(51) Int. Cl.⁷ ............................. G03F 9/00; B41N 3/00
(52) U.S. Cl. ..................... 101/463.1; 101/486; 430/300
(58) Field of Search .............................. 101/463.1, 467, 101/483, 485, 486; 430/49, 204, 300

(56) References Cited

U.S. PATENT DOCUMENTS

| | | | | |
|---|---|---|---|---|
| 5,082,755 A | * | 1/1992 | Liu | 430/5 |
| 6,211,948 B1 | * | 4/2001 | Lullau et al. | 355/71 |
| 6,480,261 B2 | * | 11/2002 | Cooper et al. | 355/53 |
| 6,613,481 B2 | * | 9/2003 | Hamada | 430/1 |

FOREIGN PATENT DOCUMENTS

| | | | |
|---|---|---|---|
| DE | 41 21 509 A1 | 1/1992 | |
| DE | 195 45 821 A1 | 6/1997 | |
| JP | 02001108 A | * 1/1990 | ......... H01L/21/027 |
| JP | 11067643 A | * 3/1999 | ......... H01L/21/027 |
| WO | 95/22787 | 8/1995 | |
| WO | 98/29782 | 7/1998 | |

OTHER PUBLICATIONS

Machine translation of JP 11067643 from Japanese Patent Office website.*

* cited by examiner

Primary Examiner—Daniel J. Colilla
(74) Attorney, Agent, or Firm—Michael J. Striker

(57) ABSTRACT

A method for exposing print media formed as printed plates with the use of UV light from a light source that is modified by a projection unit with respect to direction and/or intensity, the method comprising the steps of in a first process appearing an image of a calculated and stored partial image from the projection unit on the print medium; in a second process positioning the projection unit relative to the print medium by a positioning unit; optimizing joining of partial images into one image by running the first process and the second process in parallel with coordination of the first process and the second process by a higher-level unit via control of lines, and by providing at least one unit in which one or more trigger signals are generated for starting and ending the second process to move the projection unit to a next partial unit, and for the first process for starting and ending an exposure, so that the trigger signals are evaluated by a receiver formed as the higher-level unit.

6 Claims, 1 Drawing Sheet

METHOD FOR SYNCHRONIZING POSITIONING AND EXPOSURE PROCESSES

BACKGROUND OF THE INVENTION

Figure 1:
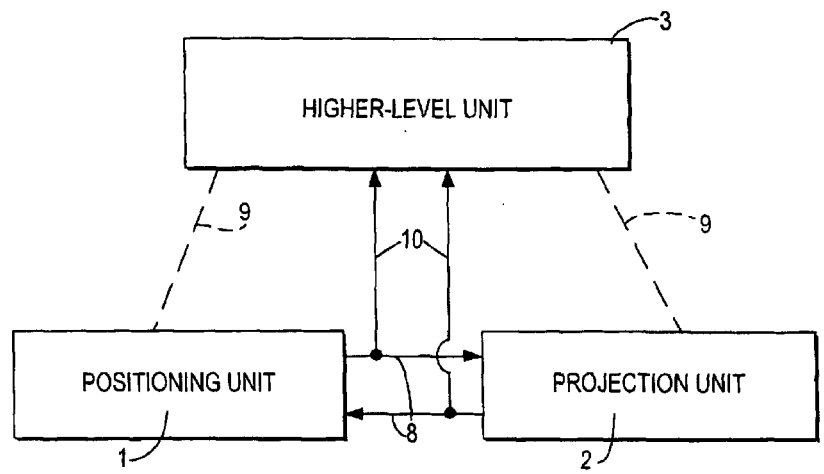

The invention concerns a method for exposing print media, in particular printing plates, using light, in particular UV light, from a light source, that is modified by a projection unit, in particular in terms of direction and/or intensity, whereby, in a first process, an image of a calculated and stored partial image from the projection unit appears on the print medium and, in a second process, the projection unit is positioned relative to the print medium by means of a positioning unit.

An exposure device of this type that is used to expose printing plates using ultraviolet light was made known in DE 195 45 821 A1, for example. According to this, the master to be imaged is broken down into partial images using a computer, and the partial images are depicted sequentially on an electronically controllable light modulator, e.g., an LCD screen penetrated by radiation, or a digital mirror device. The exposure device is then moved gradually over the printing plate to be exposed, and the light modulator with the matching partial image in each case is driven.

An exposure device is made known in U.S. Pat. No. 5,523,192 in which the image to be exposed on a base is broken down column-by-column using a computer and displayed on a rectangular modulator having multiple columns. To expose the entire image, the base is moved continuously transverse to the column direction and, at the same time, the image contents are transferred to the modulator from one column to the next adjacent column, so that the previous column can accept new image contents, until the entire image has been processed.

Other known digital exposure devices use the control of an LCD to generate images in an exposure apparatus, the DSI process (digital screen imaging). The DSI process is based on a matrix of points arranged in a grid pattern, whereby every point in this light matrix can be controlled individually so that light from the light source is transmitted or absorbed. The projection of this matrix onto the medium to be exposed results in an illuminated area of 0.5 to a few square centimeters, depending on the enlargement ratio of the imaging unit that was selected.

Larger areas are illuminated by first breaking down the image into partial images. The partial images are imaged sequentially by the projection unit onto the carrier to be exposed, whereby the projection unit is moved in steps and each partial image is projected onto the medium to be exposed. The joining of these partial images takes place with a high degree of precision, so that no lines separating the individual partial images are visible. Accuracies of <2 μm are typical; otherwise the eye would react with great sensitivity to the pattern that would result.

A computer-based control software program controls the exposure device. This software supplies the digital light matrix with the necessary image information via the graphic card, and it supplies the positioning unit with the necessary location information via a field bus system.

As with every other direct exposure process, the DSI process includes a serial process. Different areas of the material to be illustrated are exposed at different times. Specific to the DSI process, however, is the fact that the pure exposure times and the positioning times are independent of each other.

With laser-based, scanning exposure devices, the deflection speed is coupled to the exposure time. In the DSI process, the positioning time is a machine-based constant, while the exposure time is adjusted by the dwell time between two positioning processes.

When creating publications, especially daily newspapers, time is a particularly crucial factor when creating printing plates, because information that is received in the final minutes before printing must be included in the printing run. It is therefore desirable to postpone the creation of printing plates for as long as possible.

SUMMARY OF THE INVENTION

The object of the invention, therefore, is to provide a method that accelerates the process of producing publications.

The object of the invention is attained by the fact that a joining of partial images into one image is optimized by performing the first process and the second process in parallel. Printing plates were previously created using similar systems in sequential sub-steps that, in addition, were tied to a fixed system clock. As a result, a considerable amount of time is lost every time a partial image is calculated. Running the processes in parallel allows the production time to be optimized without considerable technical expense, e.g., in the form of a faster positioning unit or a faster central processor.

The object of the invention is attained by the fact that the joining of partial images into one image is optimized by performing the first process and the second process in parallel, by coordinating the first process with the second process by means of a higher-level unit via control lines, and by providing at least one unit in which one or more trigger signals are generated, especially for starting and ending the second process to move the projection unit to the next partial image, and for the first process, especially for starting and ending the exposure, whereby trigger signals are evaluated by a receiver, in particular the higher-level unit. The printing plates were previously developed using similar systems in sequential sub-steps that were also tied to a fixed system clock. As a result, a considerable amount of time is lost with every calculation of a partial image. Running the processes in parallel allows the production time to be optimized without considerable technical expense, e.g., in the form of a faster positioning unit or a faster central processor.

The invention allows the image data to be processed during the positioning process itself, and the print medium can therefore be exposed as soon as the projection unit is positioned exactly, whereby the higher-level unit-together with the trigger signals-make it possible to decouple the processes from the system clock. The sequence can be tied to conditions and does not have to be divided into cycles. The positioning and exposure processes can therefore be subjected to a plausibility check and simpler control. System security plays an increasingly crucial role given our current focus on time and the need to achieve reliable results at the last minute. Monitoring functions and displaying the progress of the exposure process are just two potential applications.

According to a further exemplary embodiment, the trigger signals are generated by the positioning device and the projection unit and are used by these via a message line for synchronization, whereby a monitoring line is preferably installed from the message line to the higher-level unit. In this fashion, synchronization is not tied to a protocol or fixed system clocks. Instead, the sequence is controlled by the processes themselves. It is further possible to integrate a user interface in the higher-ranking control. This allows standard components of operating systems and programming aids to be incorporated.

According to a further exemplary embodiment, the partial images for the projection unit are calculated to modify the light from the light source while the projection unit is being positioned. Valuable time is otherwise lost during this positioning time, which is used here to calculate the next image data to be displayed, to store the image, and to control the projection unit.

It is further provided that every partial image is stored temporarily in the projection unit until the trigger signal for the end of positioning is sent. With this embodiment of the invention, the time required for the entire process is optimized, because the stored partial image can be displayed and the next position can be driven directly after positioning. This can save from 21 to 42 ms each time a partial image is generated.

According to a further exemplary embodiment, a blank partial image is recognized by the higher-level unit and passed over. Many printed items comprise an optical density of just 5%, according to the "Dr. Grauert" test standard. A white partial image is then passed over, and the positioning is continued directly with the next partial image. The acceleration processes of the positioning unit are therefore reduced considerably. Since a white partial image often occurs in the generation of partial images, this measure can further reduce the time required for the exposure job.

The invention is described in a preferred exemplary embodiment with reference to a drawing, whereby further advantageous details can be drawn from the figures of the drawing. Equally-acting parts are labelled with the same reference numerals in both figures.

DESCRIPTION OF THE PREFERRED EMBODIMENTS

FIG. 1: Schematic drawing of the control units

Figure 2:
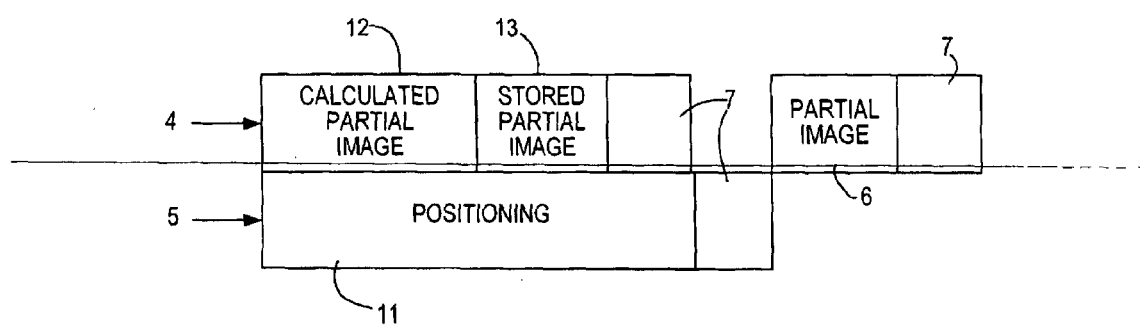

FIG. 2: Schematic drawing of the positioning and partial image-generation process.

DESCRIPTION OF THE PREFERRED EMBODIMENTS

FIG. 1 shows the control units of the exposure device in a potential exemplary embodiment. The higher-level unit 3 has a monitoring and controlling function. It coordinates and synchronizes the sequence of image generation steps by the sub-units to perform positioning and exposure. The distribution of information to the two sub-units, positioning unit 1 and projection unit 2, must take place by means of the higher-level unit 3, which "knows" and manages the entire exposure job. In a simple exemplary embodiment of the method, represented by the thin, dashed control lines 9, this entity is also responsible for synchronizing these two processes, i.e., initiating the start of exposure and positioning, and detecting the end of exposure and positioning. Due to the communication times, e.g., in the field bus system used, many ms can be required with these synchronization tasks to expose every partial image. When many thousands of partial images are exposed, these many ms add up to potential savings that are notable.

In an optimized exemplary embodiment, represented by the additional message lines 8 and monitoring lines 10, synchronization takes place via special message lines 8 between positioning unit 1 and projection unit 2, so it is not tied to a protocol or fixed system clocks. The higher-level unit 3 only receives messages about exposure and positioning starts by means of trigger signals 7, in order to guarantee a plausibility check.

FIG. 2 is a schematic drawing of the positioning and partial image-generation processes. While the projection unit 2 is being positioned exactly at the location of the first partial image 6, the content of the first partial image 6 is being calculated in parallel. After the calculation, a trigger signal 7 is output to display the end of the partial image calculation. This trigger signal 7 is transmitted either to the higher-level unit 3 only, or, in an improved exemplary embodiment, to the positioning unit 1 and the higher-level unit 3.

As soon as the signal for the end of the positioning and the signal for the completed partial image storage are transmitted, the partial image 6 is displayed by the projection unit 2. As soon as the trigger signal 7 for the end of exposure is sent, the positioning and the partial image calculation is started for the next partial image 6.

In the method in accordance with the invention, in a first process 4, an Image of a calculated 12 and stored 13 partial image 6 from the projection unit 2 appears on the print medium, and in a second process 5, the projection unit 2 is positioned 11 relative to the print medium by means of the positioning unit 1. The joining of partial images 6 into one image is optimized by running the first process 4 and the second process 5 in parallel.

What is claimed is:

1. A method for exposing print media formed as printed plates with the use of UV light, from a light source, that is modified by a projection unit with respect to direction and/or intensity, the method comprising the steps of in a first process providing an image of a calculated and stored partial image from the projection unit on the print medium; in a second process positioning the projection unit relative to the print medium by a positioning unit; optimizing joining of partial images into one image by running the first process and the second process in parallel with coordination of the first process and the second process by a higher-level unit via control lines, and by providing at least one unit in which one or more trigger signals are generated for starting and ending the second process to move the projection unit to a next partial image, and for the first process for starting and ending an exposure, so that the trigger signals are evaluated by a receiver formed as the higher-level unit.

2. A method as defined in claim 1; and further comprising the generating the trigger signals by the positioning unit and the projection unit, and using the trigger signals via at least one message line for synchronization.

3. A method as defined in claim 1; and further comprising installing a monitoring line from a message line to the higher-level unit.

4. A method as defined in claim 1; and further comprising calculating the partial images for the projection unit to modify the light emitted from the light source while the projection unit is being positioned.

5. A method as defined in claim 1; and further comprising storing every partial image temporarily in the projection unit until the trigger signal for the end of the positioning is sent.

6. A method as defined in claim 1; and further comprising recognizing a blank partial image and passing it over by the higher-level unit.

* * * * *